US010204904B2

(12) United States Patent
Zang et al.

(10) Patent No.: US 10,204,904 B2
(45) Date of Patent: Feb. 12, 2019

(54) METHODS, APPARATUS AND SYSTEM FOR VERTICAL FINFET DEVICE WITH REDUCED PARASITIC CAPACITANCE

(71) Applicant: GLOBALFOUNDRIES INC., Grand Cayman (KY)

(72) Inventors: Hui Zang, Guilderland, NY (US); Rinus Tek Po Lee, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 26 days.

(21) Appl. No.: 15/592,172

(22) Filed: May 10, 2017

(65) Prior Publication Data

US 2018/0331097 A1 Nov. 15, 2018

(51) Int. Cl.

| | |
|---|---|
| ***H01L 27/088*** | (2006.01) |
| ***H01L 21/8234*** | (2006.01) |
| ***H01L 21/764*** | (2006.01) |

(52) U.S. Cl.

CPC ........ *H01L 27/0886* (2013.01); *H01L 21/764* (2013.01); *H01L 21/823418* (2013.01); *H01L 21/823431* (2013.01); *H01L 21/823437* (2013.01); *H01L 21/823462* (2013.01); *H01L 21/823468* (2013.01); *H01L 21/823481* (2013.01)

(58) Field of Classification Search

None

See application file for complete search history.

(56) References Cited

U.S. PATENT DOCUMENTS

| | | | | |
|---|---|---|---|---|
| 8,236,696 | B2 * | 8/2012 | Cho | H01L 29/66795 257/327 |
| 9,530,700 | B1 * | 12/2016 | Mallela | H01L 27/0924 |
| 10,109,535 | B2 * | 10/2018 | Mallela | H01L 21/823885 |
| 2014/0008706 | A1 * | 1/2014 | Sudo | H01L 29/66795 257/288 |
| 2017/0162650 | A1 * | 6/2017 | Cheng | H01L 29/0649 |
| 2018/0006128 | A1 * | 1/2018 | Cheng | H01L 23/482 |

* cited by examiner

*Primary Examiner* — Hrayr A Sayadian

(74) *Attorney, Agent, or Firm* — Williams Morgan, P.C.

(57) ABSTRACT

A method, apparatus and system are disclosed herein for a finFET device having an air gap spacer and/or a tapered bottom dielectric spacer for reducing parasitic capacitance. A first source/drain (S/D) region is formed on a substrate. A set of fin structures are formed above the first S/D region. A gate region is formed above the first S/D region and adjacent at least a portion of the fin structures. A space for an air gap is formed above the gate region. A top epitaxial (EPI) feature is formed extending over the space for the air gap, thereby forming an air gap spacer between the top epitaxial feature and the gate region.

20 Claims, 13 Drawing Sheets

METHODS, APPARATUS AND SYSTEM FOR VERTICAL FINFET DEVICE WITH REDUCED PARASITIC CAPACITANCE

BACKGROUND OF THE INVENTION

Field of the Invention

Generally, the present disclosure relates to the manufacture of sophisticated semiconductor devices, and, more specifically, to various methods for reducing parasitic capacitance in a vertical finFET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than a threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

In contrast to a planar FET, which has a flat structure, there are so-called 3D devices, such as a FinFET device, which is a 3-dimensional structure. More specifically, in a FinFET, a generally vertically positioned, fin-shaped active area is formed and a gate electrode encloses both of the sides and the upper surface of the fin-shaped active area to produce a channel having a 3-dimensional structure instead of a planar structure. In some cases, an insulating cap layer, e.g., silicon nitride is positioned at the top of the fin-shaped active areas.

FinFET designs form these "fins" on the surface of a semiconductor wafer using selective-etching processes. The fins may be used to form a raised channel between the source and drain of a transistor. The gate is then deposited such that it wraps around the fin. This 3-dimensional channel is relatively thin, and thus, the gate generally has significant control over the carriers within. However, the shape of the channel may limit the current flow. Therefore, multiple fins may be used in parallel to provide greater current flow for increased drive strength.

To satisfy the ever-increasing desire for a smaller footprint for semiconductor devices, designers have turned to vertical finFETs (vFINFETs). A vFINFET generally has a channel that is in a perpendicular configuration relative to the substrate surface. This is in contrast to conventional finFETs that have channels that are configured along the plane of the substrate surface. The vertical configuration of vFINFETs allows for increased packing density since vFINFETs provide improved scaling limits as compared to conventional finFETs.

FIG. 1 illustrates a stylized cross-sectional depiction of a typical vFINFET device. A vFINFET device 100 is comprised of a substrate 105, on which a base layer 110 is formed. A buried or bottom source/drain region 150 may be formed within the base layer 110. A plurality of fins 130 are formed atop the buried or bottom source/drain (S/D) region 150. Subsequently, a bottom spacer layer 120 is formed above the bottom S/D region 150. A gate region is formed by depositing gate metal or material 140 above the bottom spacer 120. A top spacer layer 125 is formed above the gate material 140. Further, a top S/D region 155 is formed above the top spacer 125 and the fins 130.

In contrast to conventional finFET devices, typically in vFINFET devices, an inter-dielectric layer (ILD) is not formed. As a result of the lack of an ILD layer in the vertical structure shown in FIG. 1, capacitances between the gate material 140 overlapping the top and bottom S/D regions 155, 150 may occur. As a result, a plurality of areas between the gate material 140 and the bottom S/D region 150 may develop parasitic capacitances, as depicted stylistically by the capacitors 160 shown in FIG. 1. Similarly, a plurality of areas between the gate material 140 and the top S/D region 155 may also develop parasitic capacitances, as depicted stylistically by the capacitors 165. The parasitic capacitances 160, 165 shown in FIG. 1 may cause various problems, such as current leakage, excessive power consumption, AC performance degradation, etc.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for fabricating a vertical fin field effect transistor (vFINFET) device having reduced parasitic capacitances. A first source/drain (S/D) region is formed on a substrate. A set of fin structures are formed above the first S/D region. A gate region is formed above the first S/D region and adjacent at least a portion of the fin structures. A space for an air gap is formed above the gate region. A top epitaxial (EPI) feature is formed extending over the space for the air gap, thereby forming an air gap spacer between the top epitaxial feature and the gate region.

BRIEF DESCRIPTION OF THE DRAWINGS

The disclosure may be understood by reference to the following description taken in conjunction with the accompanying drawings, in which like reference numerals identify like elements, and in which.

Figure 1:
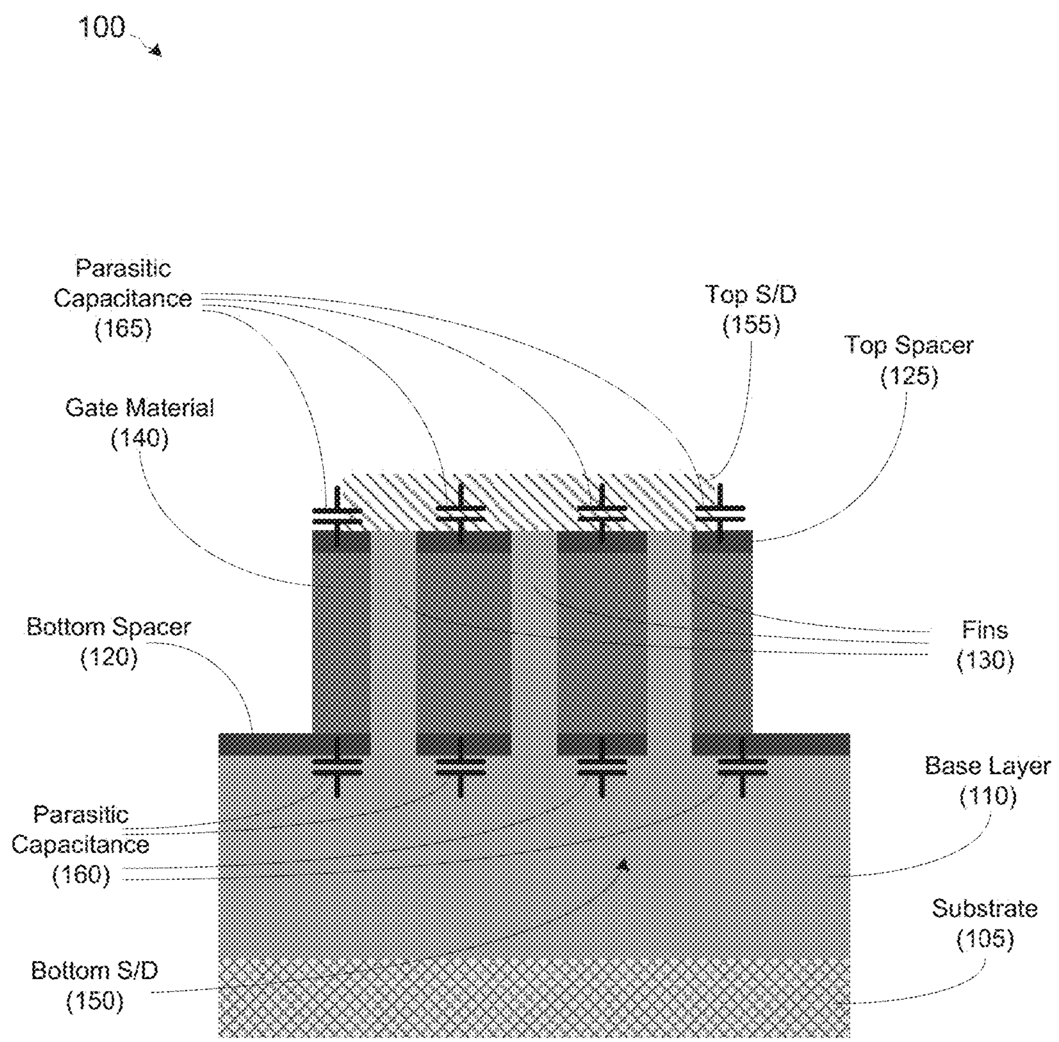
FIG. 1 illustrates a stylized cross-sectional depiction of a typical vertical finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming finFET devices (e.g., vertical finFET devices) that feature a reduced amount of parasitic capacitance. Embodiments herein provide for a vertical finFET that comprises a plurality of vertical fins, a buried source/drain region below the vertical fins, an air gap spacer, and a top S/D region above the air gap spacer. The described structure, owing at least in part to the air gap spacer, is capable of diminishing parasitic capacitances.

Embodiments herein also provide for forming a lower spacer region above the buried S/D region for reducing parasitic capacitance. Further, in some embodiments, this lower spacer region may be configured in a tapered form, wherein the center portion of the spacer region is thicker than the edges. This provides for higher resistance between the buried S/D region and the fins, thereby reducing parasitic capacitance and/or leakage currents. In some embodiments, a vertical finFET may comprise both, the lower spacer region and the air gap spacer to provide for reduced parasitic capacitance.

Figure 2:
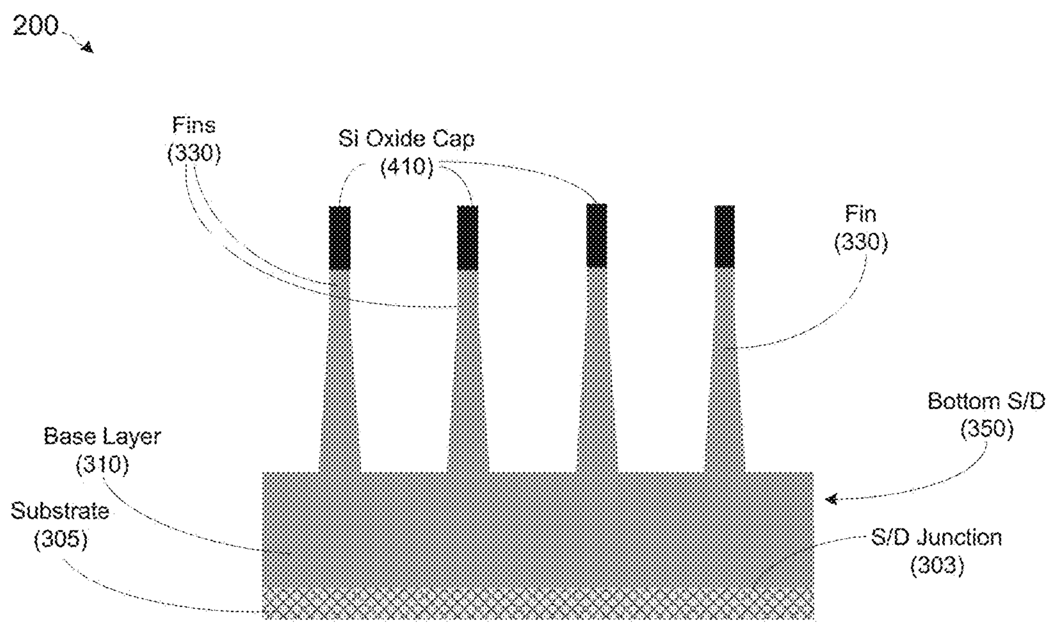
FIG. 2 illustrates a stylized cross-sectional view of a vertical finFET (device 200) under manufacture, in accordance with embodiments herein.

FIGS. 2-18 illustrate stylized cross-sectional depictions of a vertical finFET device under various stage of manufacture, in accordance with embodiments herein. FIG. 2 illustrates a stylized cross-sectional view of a vertical finFET (device 200) under manufacture, in accordance with embodiments herein. In some embodiments, initial finFET processing steps known to those skilled in the art having benefit of the present disclosure may be performed to provide a finFET device 200 under manufacture that comprises a plurality of fins. The device 200 comprises a substrate layer 305 (e.g., silicon substrate, silicon germanium substrate, etc.) on which a base layer 310 is formed. In some embodiments, the substrate layer 305 and the base layer 310 may be a single layer. Using one of various techniques known to those skilled in the art, a plurality of fins 330 are formed on the base layer 310. In one embodiment, oxide caps 410 which works as a hardmask for the formation of fins 330 may remain on top of the fins 330 after the formation thereof. Further, in many embodiments, various features, such as the fins 330, are formed on the base layer 310 in order to form a bottom or buried S/D region 350, which may be formed as part of the base layer 310. In some embodiments, each of the fins 330 may be part of a fin structure, which may include the fin 330 and a plurality of layers of materials that may be deposited on the fins 330.

Figure 3:
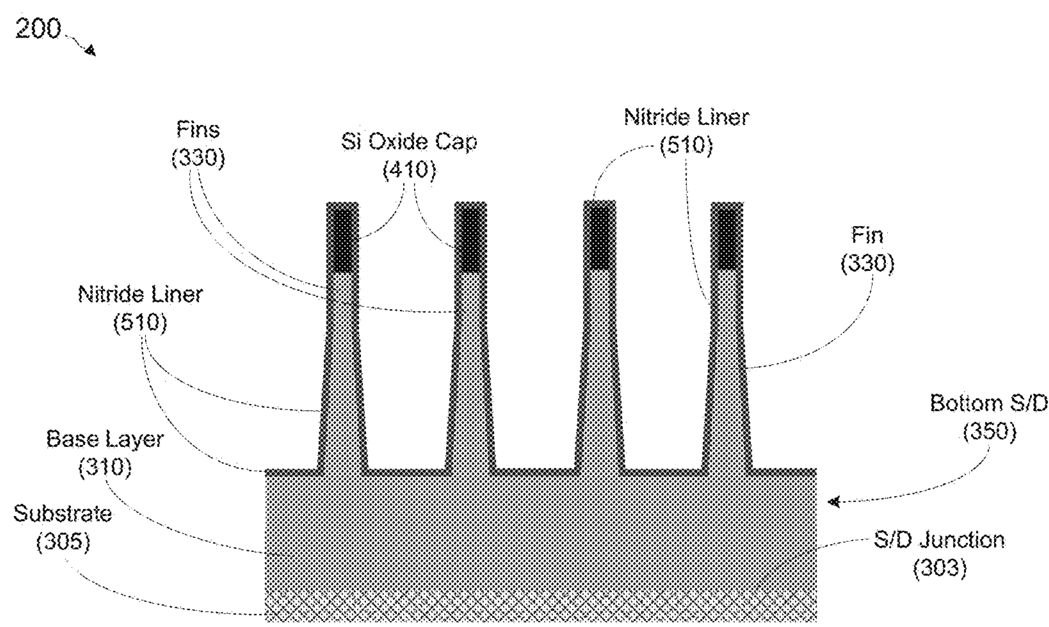
FIG. 3 illustrates a stylized cross-sectional depiction of the finFET device under manufacture with respect to an nitride liner deposition process is illustrated, in accordance with embodiments herein.

Turning now to FIG. 3, a stylized cross-sectional depiction of the vertical finFET device under manufacture with respect to a nitride line deposition process is illustrated, in accordance with embodiments herein. A nitride liner deposition process is performed. This process comprises depositing a nitride material over the fins 330. The deposition of the nitride material results in a nitride liner 510 being formed over the fins 330. The nitride material deposited above the fins 330 is thin enough to leave spaces between the fins 330, as shown in FIG. 3.

Figure 4:
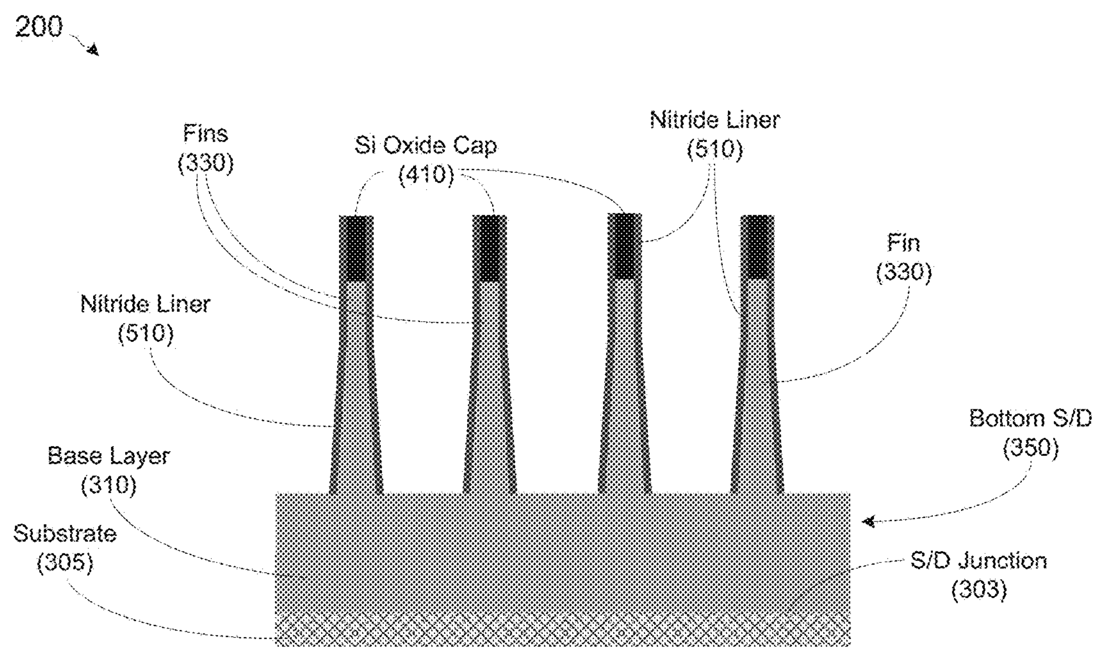
FIG. 4 illustrates a stylized cross-sectional depiction of the finFET device under manufacture with respect to a spacer etching process, in accordance with embodiments herein.

FIG. 4 illustrates a stylized cross-sectional depiction of the vertical finFET device under manufacture with respect to a spacer etching process, in accordance with embodiments herein. An etching process may be performed, removing a portion of the nitride liner 510 above and between the fins 330. This etching process may be performed by an anisotropic (or directional) etching process. In one embodiment, this etching process may be a reactive-ion etching (RIE) process. The remaining nitride liner 510 portions may cover sidewalls of fins 330, and act to reduce or prevent oxidization of the fins 330. The processes illustrated in FIGS. 3-4 result in fin structures that each comprises a fin 330, an oxide cap 410 on the top, and a nitride liner 510 at the sidewalls of the fin 330.

Figure 5:
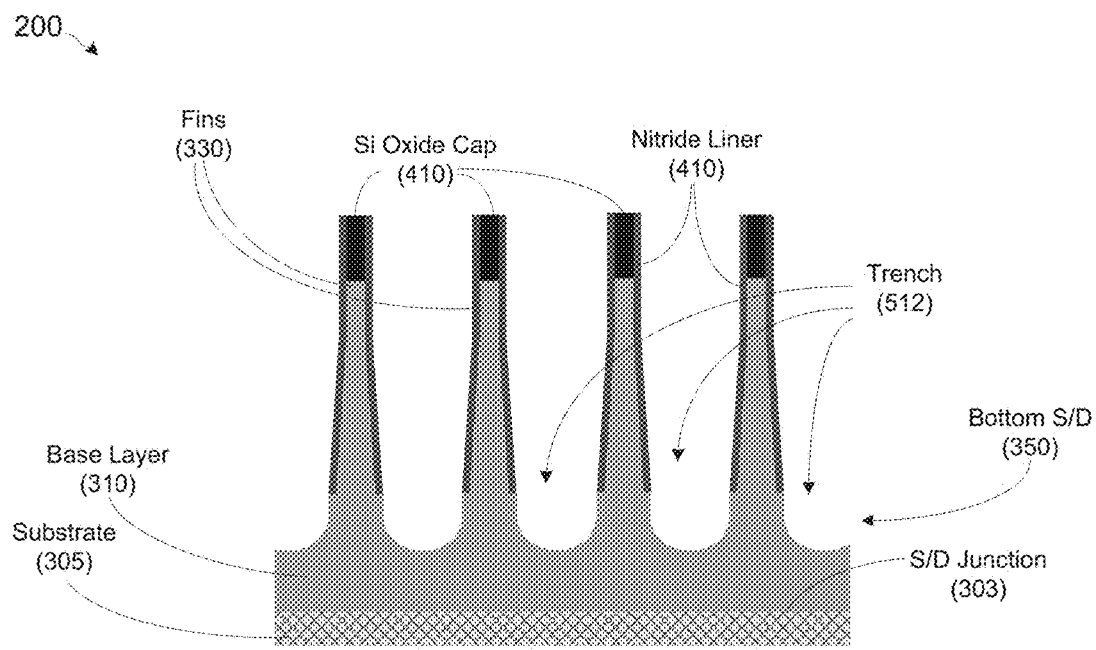
FIG. 5 illustrates a stylized cross-sectional depiction of the finFET device under manufacture with respect trench formation process, in accordance with embodiments herein.

FIG. 5 illustrates a stylized cross-sectional depiction of the vertical finFET device under manufacture with respect to a trench formation process, in accordance with embodiments herein. A plurality of trench features may be formed between and adjacent the fins 330. In some embodiments, a trench RIE (i.e., a silicon RIE) process may be performed to etch back a portion of the base layer 310 to a predetermined depth (e.g., from a range of about 5 nm to about 120 nm nm), and in some embodiments, about 40 nm. The trench RIE process is performed in such a manner that a plurality of trenches 512 are formed. In one embodiment, the trenches 512 may be formed such that they comprise a concave inner portion as exemplified in FIG. 5. In this manner, the center portions of the trenches 512 are deeper (i.e., at a lower height) than the side portions of the trenches 512, where the side portions at a greater height.

Figure 6:
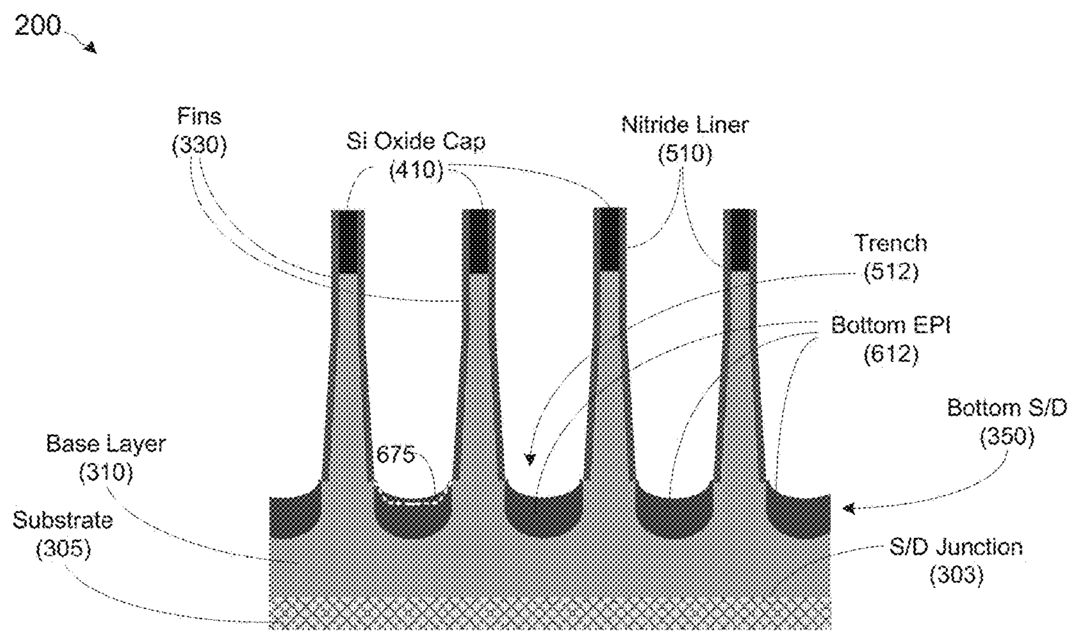
FIG. 6 illustrates a stylized cross-sectional depiction of the finFET device under manufacture with respect to a source/drain epitaxial (EPI) layer growth process, in accordance with embodiments herein.

FIG. 6 illustrates a stylized cross-sectional depiction of the vertical finFET device under manufacture with respect to a source/drain epitaxial (EPI) layer deposition/growth process, in accordance with embodiments herein. An EPI deposition/growth process may be performed to form a plurality of bottom EPI features 612 in a portion of each of the trenches 512.

Those skilled in the art having benefit of the present disclosure would appreciate that a plurality of process steps are performed in order to form EPI formations in the bottom S/D regions 350. Subsequently, undergrowth EPI formations 612 are formed in the trenches 512 in the bottom S/D region 350. In one embodiment, the EPI formations 612 may be formed in a generally concave shape, substantially conforming to the generally concave shape of the trenches 512. In one embodiment, the top surface of the bottom EPI features 612 may be configured to comprise a generally concave shape. In an alternative embodiment, the top surface of the bottom EPI features 612 may be configured to comprise generally sharp lines and edges, as represented by the dotted lines 675.

In some embodiments, the EPI features 612 may be grown to a size in the range of about 5 nm to about 20 nm (lateral EPI width). The EPI features 612 may be deposited using an ultra-high vacuum chemical vapor deposition process (CVD) process (UHVCVD). The precursors for the EPI features 612 may comprise gases comprising silicon (e.g., $SiH_4$, $Si_2H_4Cl_2$, $Si_2H_6$, $Si_3H_8$) and/or gases comprising germanium (e.g., $GeH_4$). The partial pressures of these gases may be varied to adjust the atomic ratio of germanium to silicon. In one embodiment, the EPI layers may be grown at a temperature of 700° C., and the temperature may be decreased to 550° C. with source gas.

The deposition of the bottom EPI features 612 may be performed as a plurality of deposition-etch cycles. As illustrated in FIG. 6, generally, the shape of the EPI features 612 upon deposition may be generally a concave, curved shape immediately after EPI growth. Various process steps known to those skilled in the art may be performed with regard to forming the EPI features 612, including spacer RIE, EPI pre-clean processes, etc. These processes may be controlled in a manner as to form the concave-shaped EPI features 612 shown in FIG. 6. Further processes described below may be implemented in order to form the concave-shaped EPI features 612 into concave-shaped spacers. The shape of the concave-shaped spacers may provide for low Si S/D resistance, resulting in a reduction in parasitic capacitance at the gate region.

Figure 7:
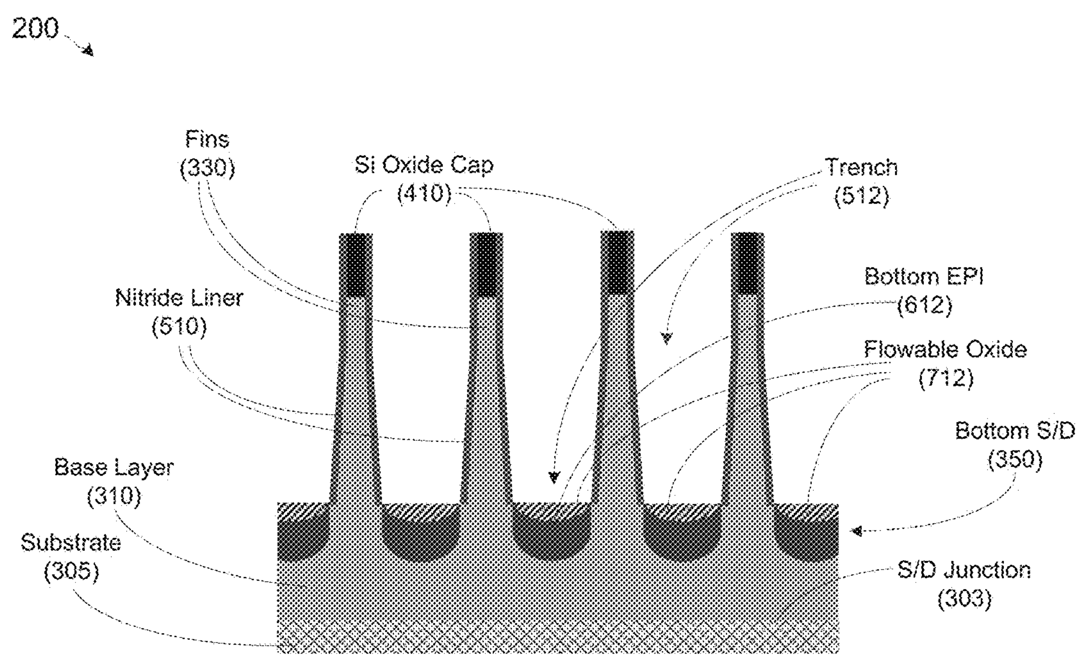
FIG. 7 illustrates a stylized cross-sectional depiction of the finFET device under manufacture with respect to a flowable oxide deposition process, in accordance with embodiments herein.

FIG. 7 illustrates a stylized cross-sectional depiction of the finFET device under manufacture with respect to a flowable oxide deposition process, in accordance with embodiments herein. Upon forming the bottom EPI features 612, a plurality of concave cavities remain above the EPI features 612 between the fins 330, as shown in FIG. 6. Turning back to FIG. 7, flowable oxide (e.g., flowable $SiO_2$) may be deposited in the concave cavities for forming oxide features 712 between the fins 330, above the bottom EPI features 612. As exemplified in FIG. 7, the oxide features 712 may be formed in a manner such that the center portion is thicker than the edges or side portions of the oxide features 712, wherein the side portions are formed in a tapered configuration. That is, the oxide features 712, which may function as oxide spacers, comprises a bottom portion, and a first side portion and a second side portion about a center region. The center region is thicker than the first and second side portions. Further, the bottom portion of the oxide features 712 conform to the curved shape of the EPI features 612. The tapered characteristic of the oxide features 712 may provide higher resistance between the bottom S/D regions 350 and the fins 330. This characteristic may provide for reduced parasitic capacitances and leakage currents.

Figure 8:
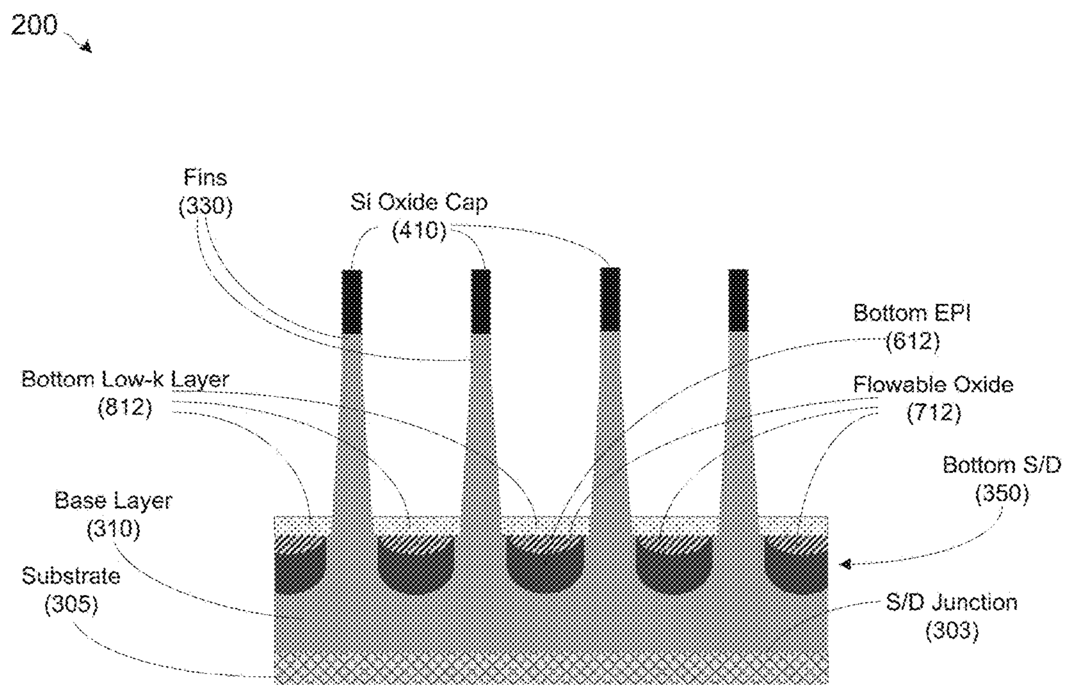
FIG. 8 illustrates stylized cross-sectional depiction of the finFET device under manufacture with respect to a low-k deposition process, in accordance with embodiments herein.

In some embodiments, prior to depositing the flowable oxide, a thin metal layer (not shown) may be formed above the bottom EPI features 612. The flowable oxide may then be deposited above the thin metal layer, resulting in a tapered set of oxide features similar to the oxide features 712. The additional metal layer above the EPI features 612 may provide for a reduction in the source/drain resistance as well as a reduction in the "on" resistance ($R_{on}$) of the device 200. Further, a recess RIE process may be performed to remove the nitride liners 510, which were used as protection for the fins 330 during various processes performed on the device 200. In one embodiment, the nitride liner removal process may be performed using a dry etch process, such as a SiCoNi™ process, a remote plasma dry etch, such as chemical oxide removal (COR) or Frontier™, or RIE Subsequently, a gate stack process may be performed to form a gate region of the device 200. The gate stack process may comprise several process steps. For example, FIGS. 8-10 describe steps associated with the gate stack process of embodiments herein. FIG. 8 illustrates stylized cross-sectional depiction of the vertical finFET device under manufacture with respect to a low-k deposition process, in accordance with embodiments herein.

A bottom low-k dielectric layer 812 is formed above the oxide layer 712 by depositing a low-k material. Those skilled in the art having benefit of the present disclosure would appreciate that the low-k material may be deposited over the fins 330 and portions between the fins 330, wherein portions above and on the sidewall of the fins 330 may be removed, resulting in the bottom low-k layer 812 shown in FIG. 8.

Examples of low-k material used for forming the low-k layer 812 may be aluminum-doped $SiO_2$, fluorine-doped $SiO_2$, carbon-doped $SiO_2$, porous $SiO_2$, porous carbon-doped $SiO_2$, SiOf, SiOCH, HSSQ, MSSQ, or other low-k materials suitable for semiconductor manufacturing. The thickness of the bottom low-k layer 812 may be in the range of about 5 nm to about 25 nm.

Figure 9:
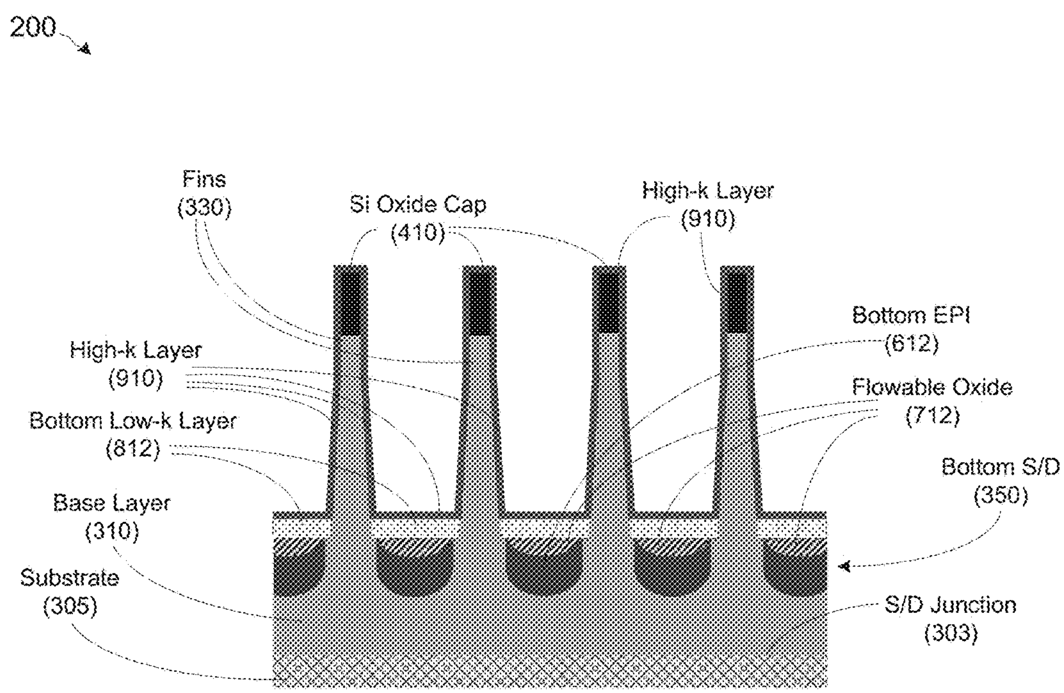
FIG. 9 illustrates stylized cross-sectional depiction of the finFET device under manufacture with respect to a high-k deposition process, in accordance with embodiments herein.

FIG. 9 illustrates stylized cross-sectional depiction of the vertical finFET device under manufacture with respect to a high-k deposition process, in accordance with embodiments herein. A high-k dielectric layer 910 may be formed above the bottom low-k layer 812. One of a plurality of types of high-k material may be deposited over the fins 330 and areas between the fins 330, thereby forming the high-k layer 910. Examples of high-k material used for forming the high-k layer 910 may be HfSiON, $HfO_2$, HfSiO, or other high-k materials suitable for semiconductor manufacturing. The thickness of the high-k layer 910 may be in the range of about 0.4 nm to about 4 nm, and in some embodiments, is about 2 nm.

Figure 10:
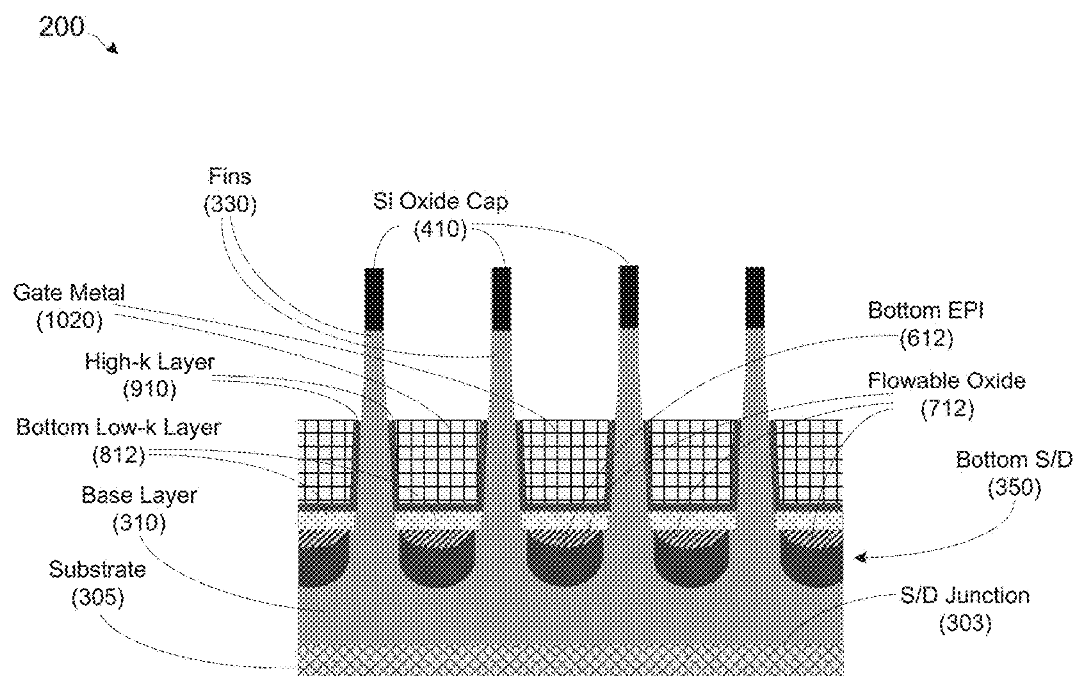
FIG. 10 illustrates stylized cross-sectional depiction of the finFET device under manufacture with respect to a gate metal deposition process, in accordance with embodiments herein.

FIG. 10 illustrates stylized cross-sectional depiction of the finFET device under manufacture with respect to a gate metal deposition process, in accordance with embodiments herein. A metallization process may be performed to form a gate metal feature 1020 adjacent each of the fins 330 in the manner shown in FIG. 10. In one embodiment, this metallization process is performed to fill the gate regions to provide high-k metal gates (HKMG). The gate regions are filled with a metal material e.g., tungsten, copper, etc.

In some embodiments, this metallization process may involve depositing a metal liner (e.g., titanium-nitride ("Ti-Nitride" or "TiN") over a thin Ti film), followed by filling with tungsten. In some embodiments, cobalt can also be used for contact metal instead of tungsten. This process may also include an etch back process to remove the high-k layer 910 above the gate metal feature 1020. FIG. 10 shows the gate regions filled with gate metal features 1020, which are separated from the fins 330 by the high-k layer 910, which are separated from the bottom S/D regions 350 by the flowable oxide layers 712 and the bottom low-k layers 812.

Figure 11:
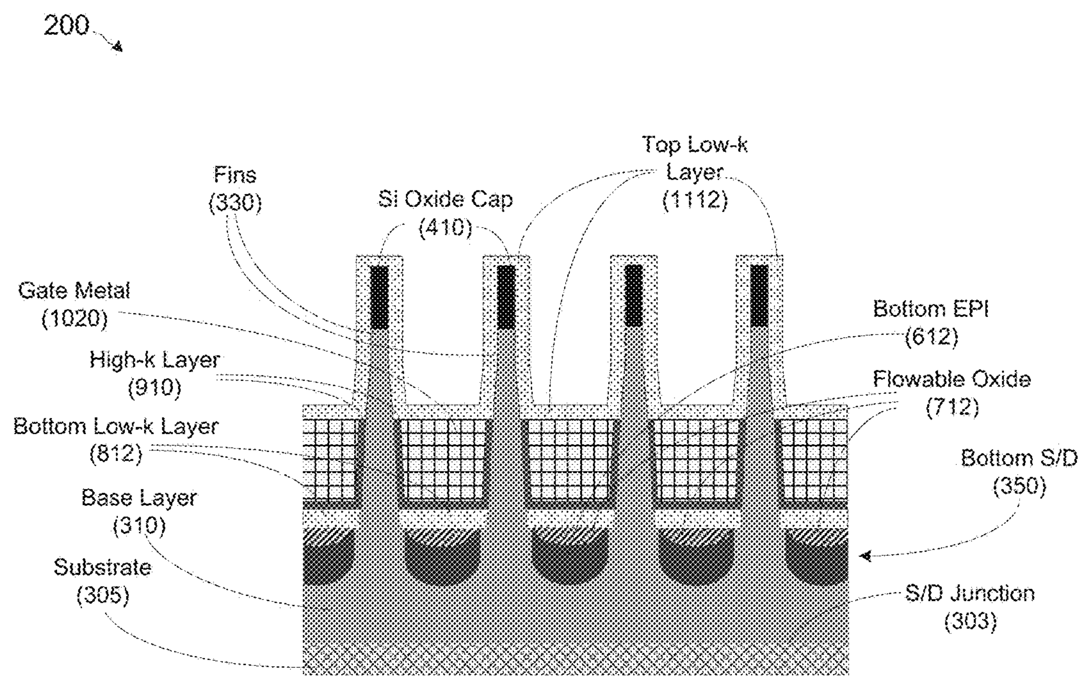
FIG. 11 illustrates stylized cross-sectional depiction of the finFET device under manufacture with respect to a second low-k deposition process, in accordance with embodiments herein.

Once the gate stack process exemplified by FIGS. 8-10 is performed, a process for forming a top S/D feature is performed, as exemplified by FIGS. 11-14. FIG. 11 illustrates stylized cross-sectional depiction of the finFET device under manufacture with respect to a second low-k deposition process, in accordance with embodiments herein. Upon completing the metallization process, described above, a second low-k deposition process may be performed to form a top low-k dielectric layer 1112 above the gate metal feature 1020, as well as on the sidewalls and top portions of the fins 330 and oxide caps 410.

Figure 12:
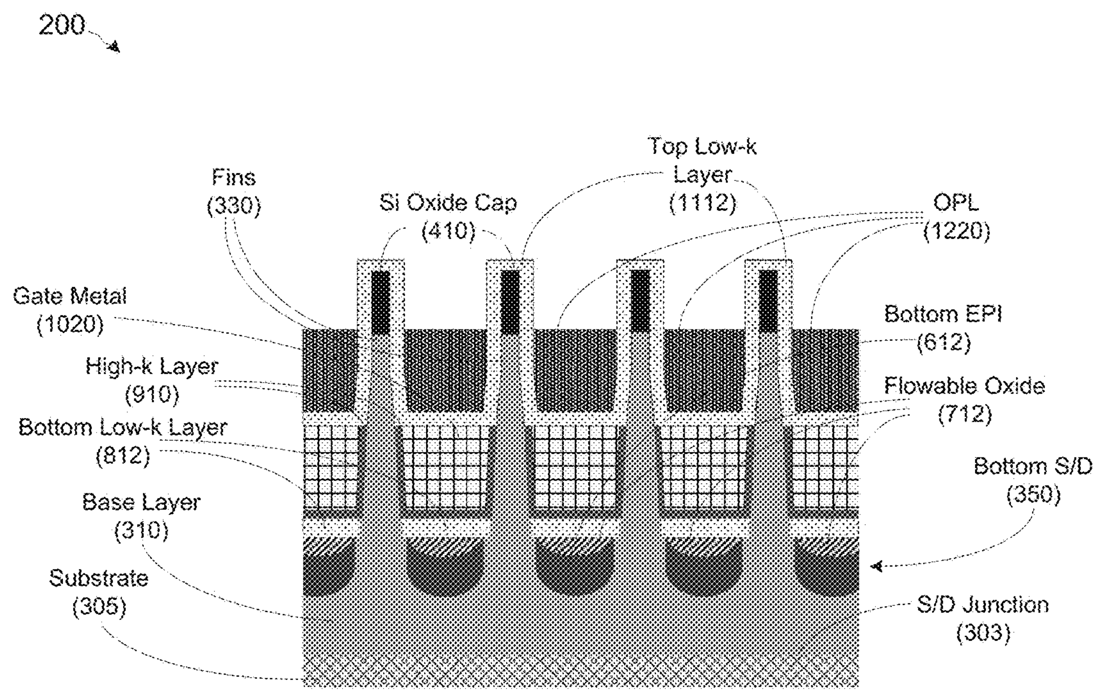
FIG. 12 illustrates stylized cross-sectional depiction of the finFET device under manufacture with respect to an OPL deposition process, in accordance with embodiments herein.

FIG. 12 illustrates stylized cross-sectional depiction of the vertical finFET device under manufacture with respect to an OPL deposition process, in accordance with embodiments herein. Upon forming the top low-k layer 1112, an organic planarization layer (OPL) 1220 is formed on a predetermined portion of the top low-k layer 1112. The OPL 1220 may be recessed to a predetermined height. This predetermined height is determined by the desired height of an air gap spacer that is to be formed over the gate metal region 1020. During an etch process, the OPL 1220 protects material beneath.

In some embodiment, formation of the OPL 1220 may include depositing organic material using spin-on dielectric (SOD) techniques. Examples of materials used to perform the SOD techniques include SiLK-I, SiLK-J, SiLK-H, SiLK-D, porous SiLK® semiconductor dielectric resins commercially available from Dow Chemical Co., and GX-3™, and GX-3P™ semiconductor dielectric resins commercially available from Honeywell Int'l.

Figure 13:
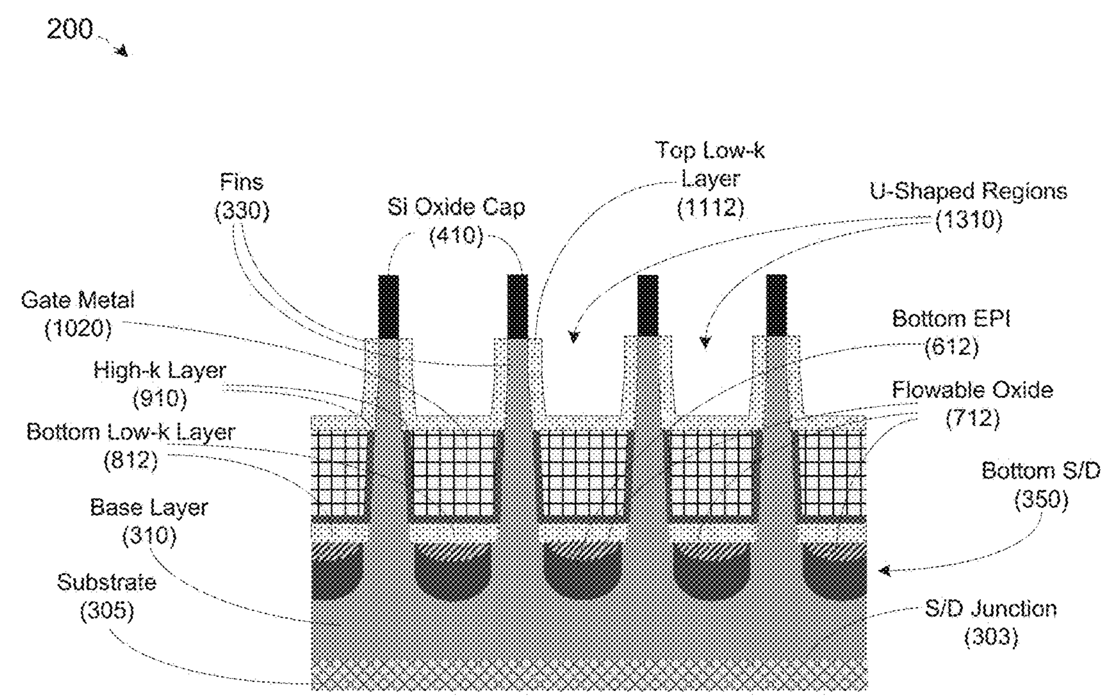
FIG. 13 illustrates stylized cross-sectional depiction of the finFET device under manufacture with respect to an etch process and the OPL removal process, in accordance with embodiments herein.

FIG. 13 illustrates stylized cross-sectional depiction of the vertical finFET device under manufacture with respect to an etch process and the OPL removal process, in accordance with embodiments herein. An etch process is performed to remove a portion of the top low-k spacer 1112 down to the level of the OPL 1220, exposing the oxide caps 410. Further, the etch process removes the OPL 1220, thereby leaving u-shaped regions 1310 (i.e., space for an air gap) between the fins 330. The u-shaped regions 1310 are lined with the top low-k layer 1112, as shown in FIG. 13.

Figure 14:
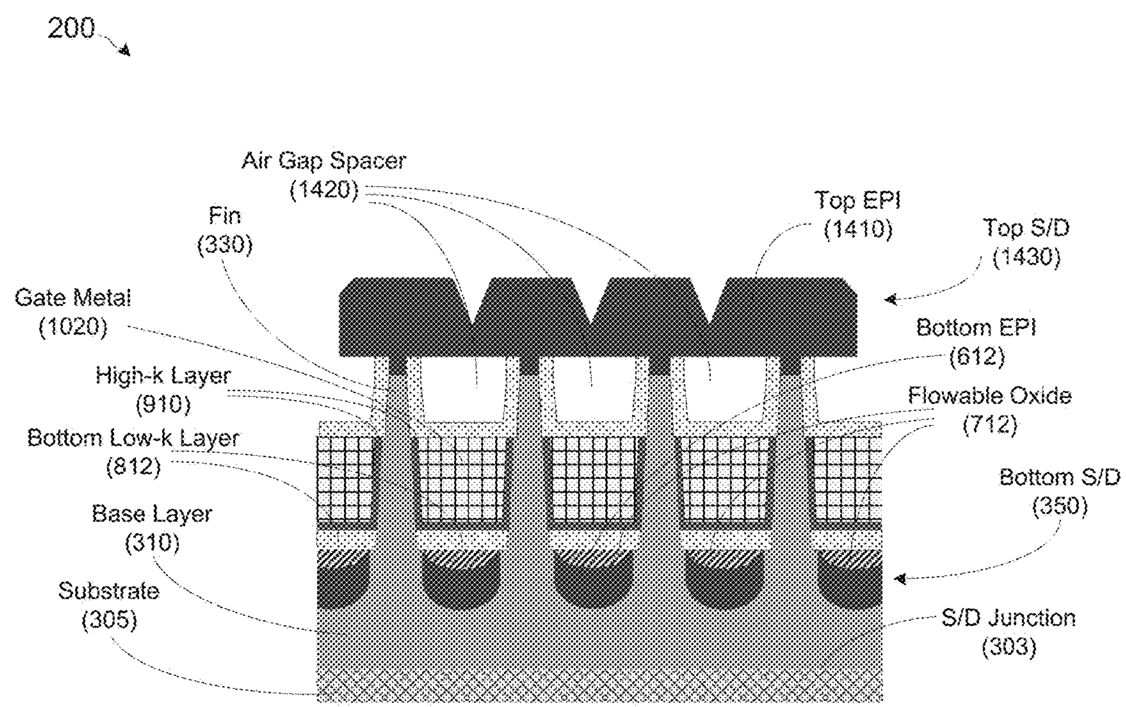
FIG. 14 illustrates stylized cross-sectional depiction of the finFET device under manufacture with respect to a top EPI formation process, in accordance with embodiments herein.

FIG. 14 illustrates stylized cross-sectional depiction of the vertical finFET device under manufacture with respect to a top EPI formation process, in accordance with embodiments herein. The oxide caps 410 are removed prior to performing the top EPI formation process. A top EPI structure 410 is formed in the manner exemplified in FIG. 14. In one embodiment, the top EPI structure 1410 may be formed using similar processes used to form the bottom EPI structures 612, as described above. The top EPI structure 1410 is formed above the u-shaped regions 1310 (FIG. 13). Therefore, upon formation of the EPI structure 1410, an air gap spacer 1420 is formed in the u-shaped regions 1310. The formation of the air gap spacer 1420 and the top EPI structure 1410 provide a top S/D region 1430.

Figure 15:
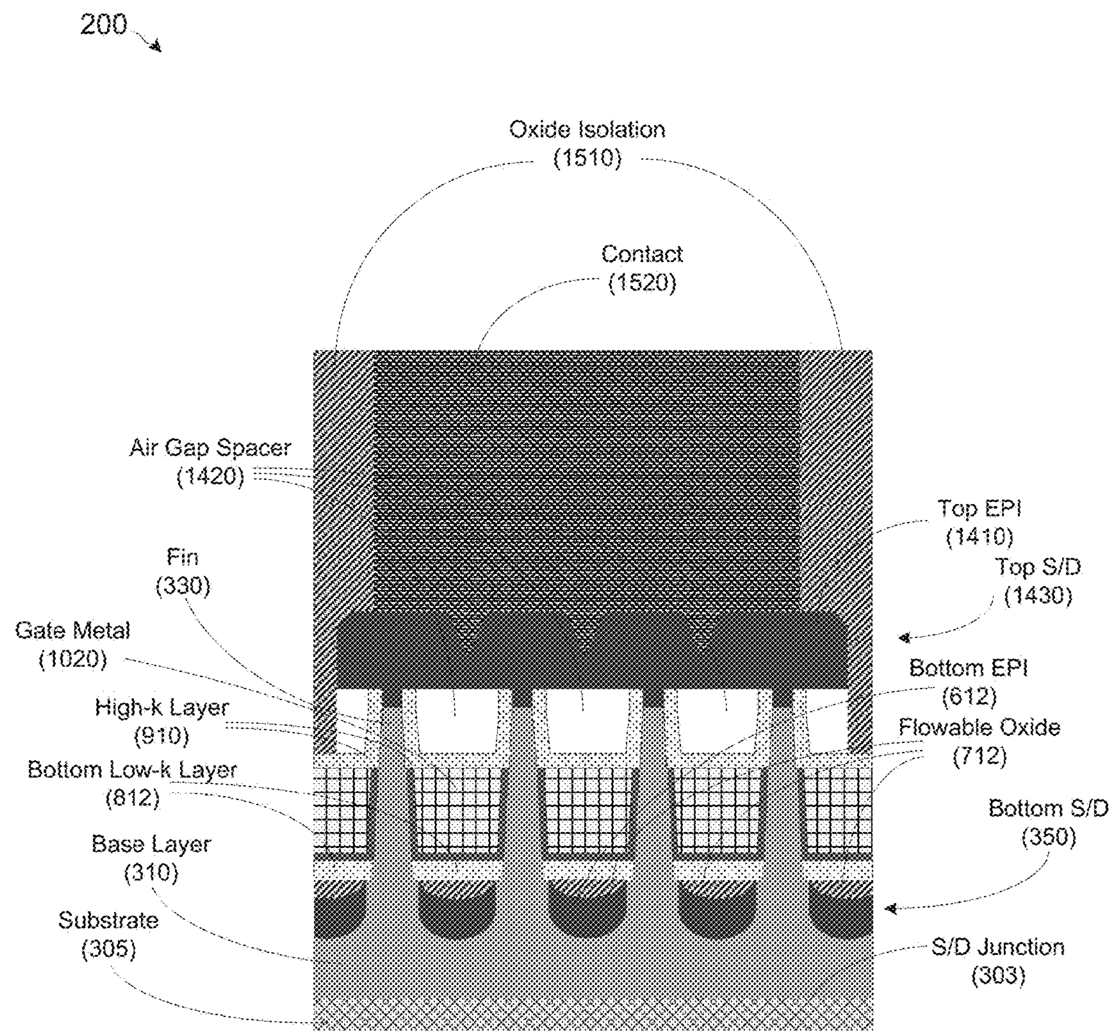
FIG. 15 illustrates a stylized cross-sectional depiction of the finFET device under manufacture with respect to forming a contact, in accordance with embodiments herein.

FIG. 15 illustrates a stylized cross-sectional depiction of the vertical finFET device under manufacture with respect to forming a contact, in accordance with embodiments herein. An oxide isolation 1510 may be formed adjacent the top S/D 1430. Those skilled in the art having benefit of the present disclosure would appreciate that additional processes, such as spacer deposition, etch processes, etc. may be performed to create a gap between the oxide isolation layers 1510 in order to form a contact region 1520. A metal material (e.g., tungsten, copper, etc.) may be deposited to form the contact region 1520 above the top S/D 1430, between the oxide isolation layers 1510. Further processing known to those skilled in the art may be performed in order to complete the vFINFET device 200, wherein the device 200 comprises a tapered bottom EPI 612, a tapered oxide spacer 712, and an air gap spacer 1420.

Figure 16:
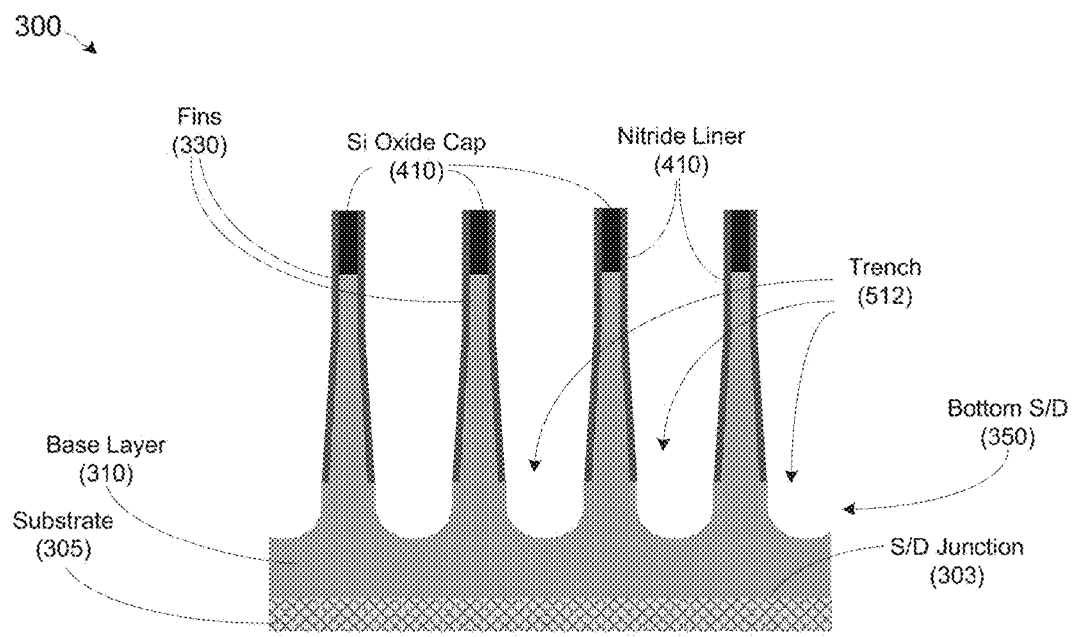
FIG. 16 illustrates stylized cross-sectional depiction of the finFET device under manufacture with respect to forming trench regions, in accordance with an alternative embodiment herein.
Figure 17:
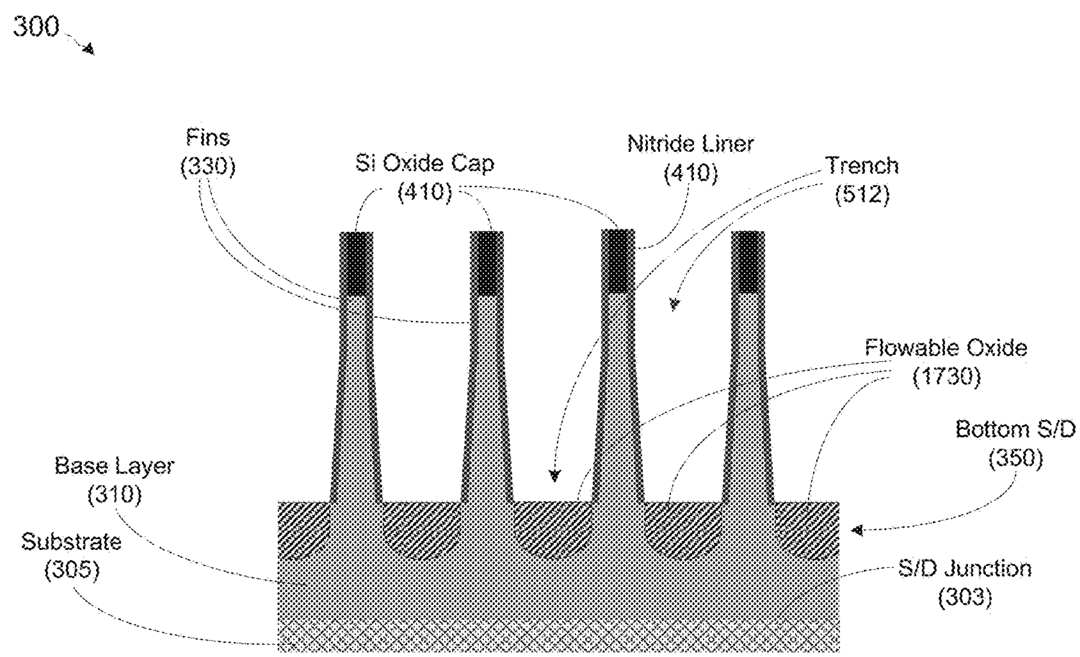
FIG. 17 illustrates stylized cross-sectional depiction of the finFET device under manufacture with respect to a depositing flowable oxide, in accordance with an alternative embodiment.
Figure 18:
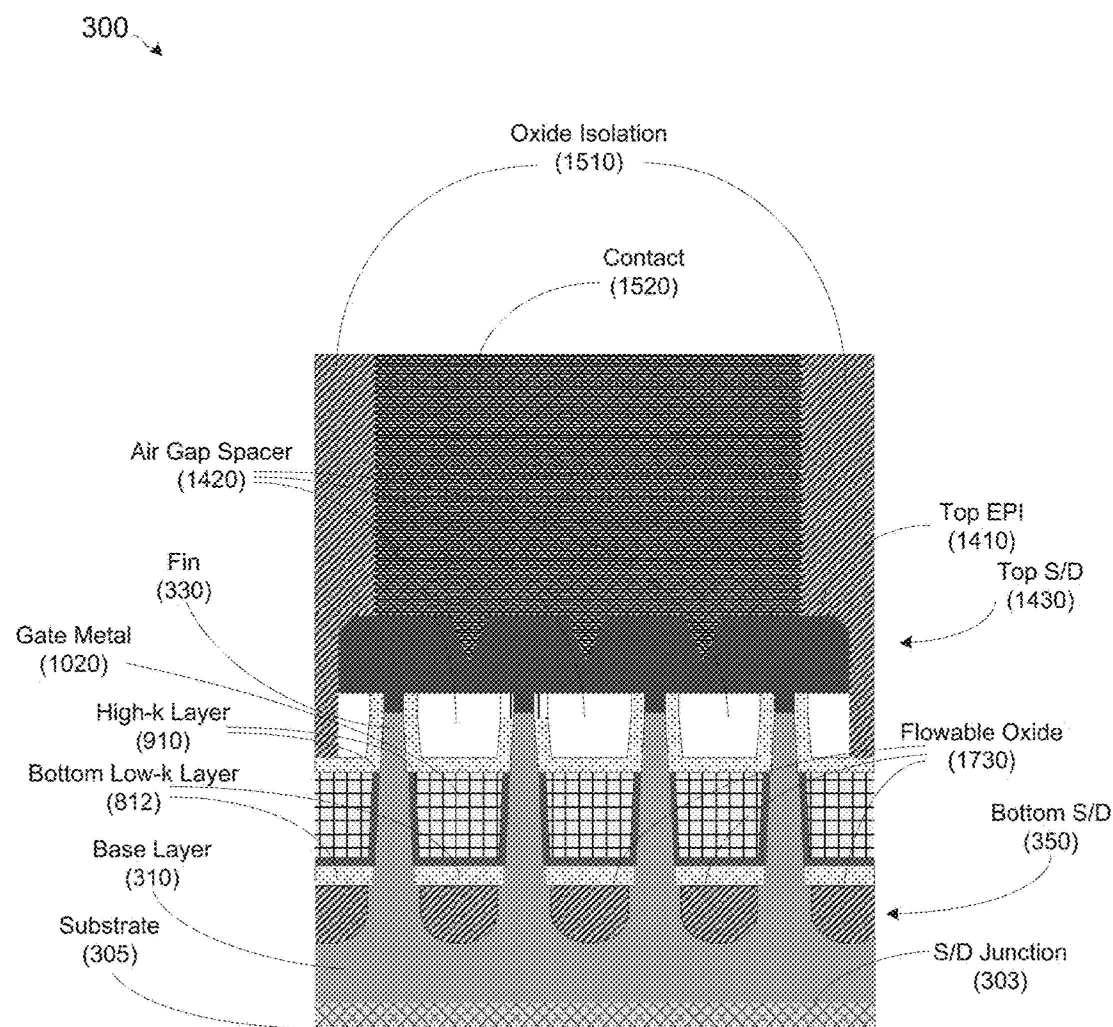
FIG. 18 illustrates a stylized cross-sectional depiction of the finFET device comprising an air gap spacer, in accordance with an alternative embodiment.

FIGS. 16-18 illustrate an alternative process flow for providing a vFINFET comprising an air gap spacer, in accordance with an alternative embodiment herein. FIG. 16 illustrates stylized cross-sectional depiction of the vertical finFET device under manufacture with respect to forming trench regions, in accordance with an alternative embodiment herein. The device 300 of FIG. 16 may have been processed in the manner described with respect to FIGS. 2-5. FIG. 16 illustrates a plurality of trench features 512 that are be formed between and adjacent the fins 330, similar to FIG. 5.

FIG. 17 illustrates stylized cross-sectional depiction of the finFET device under manufacture with respect to a depositing flowable oxide, in accordance with an alternative embodiment. As shown in FIG. 17, flowable oxide (e.g., flowable $SiO_2$) may be deposited in the concave cavities for forming oxide features 1730 between the fins 330, similar to FIG. 7 but without forming the bottom EPI features 612. As exemplified in FIG. 17, the dielectric features 1730 may be formed in a manner such that the center portion is thicker than the edges, wherein the edges are tapered, i.e., the dimensions at the edge regions are smaller than the dimensions at the center regions. The tapered characteristic of the oxide features 1730 may provide higher resistance between the bottom S/D regions 350 and the fins 330. This characteristic may provide for reduced parasitic capacitances and leakage currents.

Subsequently, processes similar to those described above with respect to FIGS. 8-15 are performed on the device 300 to arrive at the device shown in FIG. 18. FIG. 18 illustrates a stylized cross-sectional depiction of the vertical finFET device 300 comprising an air gap spacer, in accordance with an alternative embodiment. Further processing known to those skilled in the art may be performed to complete the vFINFET device 300, wherein the device 300 comprises a tapered oxide spacer 1730 and an air gap spacer 1420.

Further processes known to those skilled in the art having benefit of the present disclosure would be performed to complete the processing of the finFET device. For example, further processing steps (e.g., source/drain (S/D) formation, silicide process, back-end-of-line (BEOL) may be performed to form MOSFET devices using FinFET processes. The drain and source regions for an NMOS device may be formed from n-doped silicon or low germanium percentage SiGe material. The drain and source regions for a PMOS device may be formed from p-doped germanium or high germanium percentage SiGe material. Accordingly, the processes exemplified herein may be used to provide N-FET and/or P-FET devices using the same base semiconductor structure.

Figure 19:
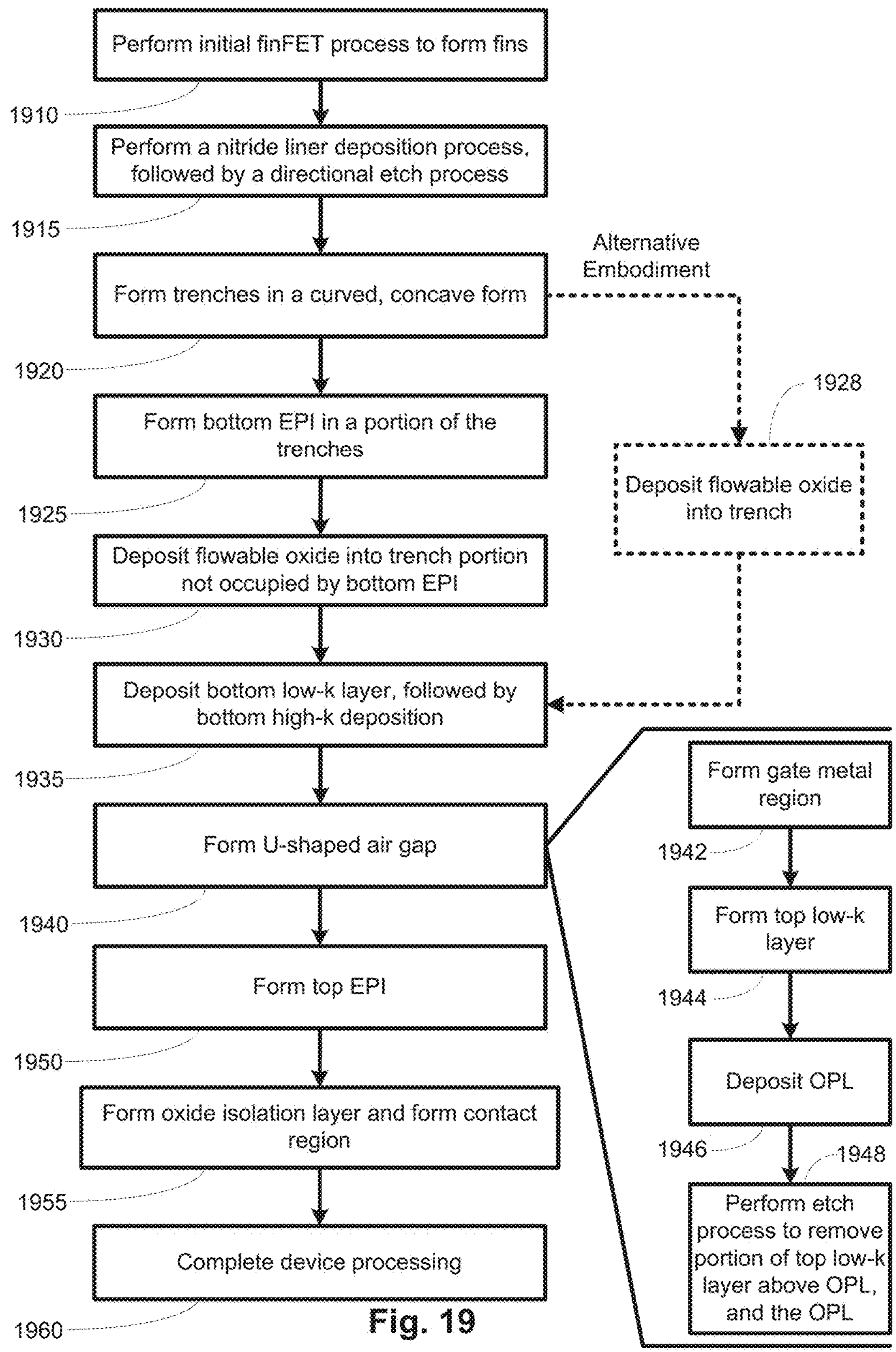
FIG. 19 illustrates a flowchart depiction of the process steps of providing a vFINFET device having an air gap spacer, in accordance with embodiments herein.

Turning now to FIG. 19, a flowchart depiction of the process steps of providing a vFINFET device having an air gap spacer, in accordance with embodiments herein, is illustrated. An initial process for forming a plurality of fins on a substrate is performed (block 1910). The fins may be formed using techniques known to those skilled in the art having benefit of the present invention. Upon forming the fins, a set of fin structures that each comprises a fin, an oxide cap, and a nitride liner.

Subsequently, a nitride liner may be deposited on the fins (block 915). In one embodiment, a thin layer of silicon nitride may be implemented, as exemplified in FIG. 3. In one embodiment, the nitride liner may be provided by performing an iRAD process. Further, a directional etch process may be performed to remove a portion of the nitride liner between the fins, in preparation of forming trenches between the fins.

A trench process may be performed to form trenches between and adjacent the fins (block 920). The trench process comprises performing an RIE process to etch back the base of the fins. The trenches may be formed to have concave inner portions (as exemplified in FIG. 5), in which further processing may be performed. Therefore, the center of the trenches are deeper compared to the sides of the trenches.

An EPI growth/deposition process may be performed in the trench regions (block 1925), as exemplified in FIG. 6, to form bottom or buried EPI features. The growth/deposition of the EPI features may be performed as a series of multiple deposition-etch cycles to form epitaxial features that are relatively conformal within the concave trenches. The bottom EPI features are formed to comprise a concave surface cavity such that additional material can be filled in the concave cavity region.

Subsequently, a flowable oxide material is deposited into the portion of the trenches that are not occupied by the bottom EPI features (block 1930), as exemplified by FIG. 7. In some embodiments, a thin metal liner may be added above the bottom EPI features prior to depositing the flowable oxide material. The flowable oxide (e.g., $SiO_2$) is deposited into the concave cavities for forming oxide features that have a tapered form, such that they are thicker in the center region and thinner in the side regions. This tapered configuration provides for higher resistance between the bottom S/D regions and the fins, which may result in reduced parasitic capacitances and leakage currents.

In an alternative embodiment, the bottom EPI features may not be formed. As denoted by the dotted lines and dotted block 1928, after formation of the concave trenches (block 1920), flowable oxide may be deposited into the trenches without forming the bottom EPI features (as exemplified in FIG. 17). The formation of the bottom EPI features and the flowable oxide layers provides for forming the bottom S/D region.

Subsequently, a low-k layer is formed above the flowable oxide layer (block 1935), as exemplified in FIG. 9. The low-k layer is formed only between the fins. Further, a high-k layer may be formed above the low-k layer (block 1935), as exemplified in FIG. 9. The high-k layer encapsulates the top portion and sidewalls of the fins, as well as the regions between and adjacent the fins.

An air gap for forming an air gap spacer is created (block 1940), as exemplified in FIGS. 8-11. A gate metal region is formed (block 1942), as exemplified in FIG. 8. A top low-k layer may be formed over the gate metal region (block 1944). An OPL may be deposited above the top low-k layer (block 1946). An etch back process is then performed to remove the low-k above the OPL, and removing the OPL. This process results in a u-shaped void above the gate stack, with the oxide cap exposed above the u-shaped void. The u-shaped void is lined with the low-k layer.

A top EPI feature is then formed above the u-shaped feature (block 1950). Similar to the bottom EPI features, the growth/deposition of the top EPI feature may be performed as a series of multiple deposition-etch cycles to form an epitaxial feature that spans the width of the fins. In this manner, a top S/D region is formed.

Subsequently, oxide isolation layer may be formed adjacent the outer fins (block 1955). Further, a contact region may be formed above the top S/D region by depositing a metal material. A chemical-mechanical planarization (CMP)

process may be performed on said oxide isolation layer and said contact regions. Upon forming the oxide isolation layer and the contact region, the vFINFET is substantially formed. Subsequent processes known to those skilled in the art having benefit of the present disclosure are performed (block 1960) to form the vFINFET device in accordance with embodiments herein.

Figure 20:
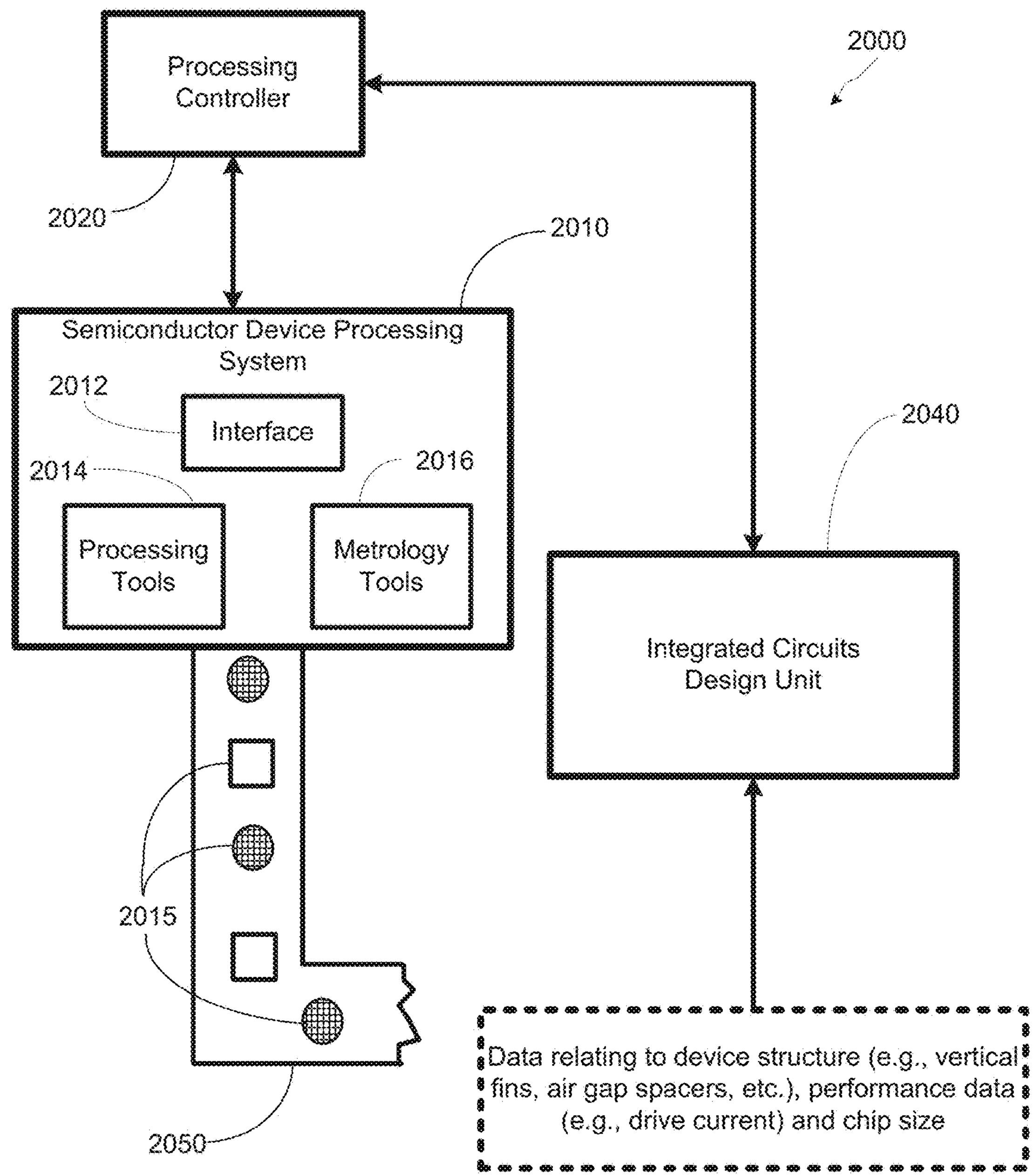
FIG. 20 illustrates a stylized depiction of a system for fabricating a semiconductor device package comprising an air gap spacer, in accordance with embodiments herein.

Turning now to FIG. 20, a stylized depiction of a system for fabricating a semiconductor device package comprising an air gap spacer, in accordance with embodiments herein, is illustrated. The system 2000 of FIG. 20 may comprise a semiconductor device processing system 2010 and a design unit 2040. The semiconductor device processing system 2010 may manufacture integrated circuit devices based upon one or more designs provided by the design unit 2040. The system 2000 is capable of performing the process steps described in FIGS. 1-19.

The semiconductor device processing system 2010 may comprise various processing stations, such as etch process stations, photolithography process stations, CMP process stations, etc. Each of the processing stations may comprise one or more processing tools 2014 and or metrology tools 2016. Feedback based on data from the metrology tools 2016 may be used to modify one or more process parameters used by the processing tools 2014 for performing process steps.

The system 2010 may also comprise an interface 2012 that is capable of providing communications between the processing tools 2014, the metrology tools 2016 and a controller, such as the processing controller 2020. One or more of the processing steps performed by the processing system 2010 may be controlled by the processing controller 2020. The processing controller 2020 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2010 may produce integrated circuits (e.g., vFINFET devices) on a medium, such as silicon wafers. More particularly, the semiconductor device processing system 2010 produce integrated circuits having vertical finFET devices that comprise an air gap spacer between a gate metal region and a top S/D region, which may comprise an EPI feature. Further, these vertical finFET devices may comprise a bottom spacer that may be in a tapered form. Further, the vertical finFETs may also comprise a concave shaped EPI formation beneath the bottom space, as described above.

The production of integrated circuits by the device processing system 2010 may be based upon the circuit designs provided by the integrated circuits design unit 2040. The processing system 2010 may provide processed integrated circuits/devices 2015 on a transport mechanism 2050, such as a conveyor system. In some embodiments, the conveyor system may be sophisticated clean room transport systems that are capable of transporting semiconductor wafers. In one embodiment, the semiconductor device processing system 2010 may comprise a plurality of processing steps, e.g., the $1^{st}$ process step, the $2^{nd}$ process set, etc., as described above.

In some embodiments, the items labeled "2015" may represent individual wafers, and in other embodiments, the items 2015 may represent a group of semiconductor wafers, e.g., a "lot" of semiconductor wafers. The integrated circuit or device 2015 may be a transistor, a capacitor, a resistor, a memory cell, a processor, and/or the like. In one embodiment, the device 2015 is a transistor and the dielectric layer is a gate insulation layer for the transistor.

The integrated circuit design unit 2040 of the system 2000 is capable of providing a circuit design that may be manufactured by the semiconductor processing system 2010. This may include information regarding the bottom tapered spacer and/or the air gap spacer for vFINFET devices described above. The integrated circuit design unit 2040 may be capable of determining the number of devices (e.g., processors, memory devices, etc.) to place in a device package. The integrated circuit design unit 2040 may also determine the height of the gate fins, the S/D fins, the dimensions of the bottom spacer, bottom EPI, top EPI, air gap spacer, etc. These dimensions may be based upon data relating to drive currents/performance metrics, device dimensions, etc. Based upon such details of the devices, the integrated circuit design unit 2040 may determine specifications of the vertical finFETs that are to be manufactured. Based upon these specifications, the integrated circuit design unit 2040 may provide data for manufacturing a semiconductor device package described herein. Although, the process steps set forth above are generally described in the context of vertical finFETs, those skilled in the art having benefit of the present disclosure would appreciate that the process steps may also be performed on standard finFET devices.

The system 2000 may be capable of performing analysis and manufacturing of various products involving various technologies. For example, the system 2000 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2000 to fabricate the devices 200, 300 described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

forming a first source/drain (S/D) region on a substrate;

forming a set of fin structures above said first S/D region;

forming a gate region above said first S/D region and adjacent at least a portion of said fin structures;

forming a space for an air gap above said gate region; and forming a top epitaxial (EPI) feature extending over said space for the air gap, thereby forming an air gap spacer between said top epitaxial feature and said gate region.

2. The method of claim 1, further comprising:

forming a trench adjacent each of said fins within said first S/D regions, wherein each trench comprises a first side portion, a center portion, and a second side portion, wherein said center portion of the trenches is deeper than said first and second side portions of the trenches, forming a curved shape at the bottom portion of the trenches; and forming an oxide spacer in each of said trenches, wherein each oxide spacer comprises a bottom portion, and a first side portion and a second side portion about a center region, wherein said bottom portion of said oxide spacers conform to said curved shape of said trenches, and wherein said center region of the oxide spacers is thicker than the first and second side portions of the oxide spacers.

3. The method of claim 2, further comprising forming a bottom EPI feature in a portion of each of said trenches, said bottom EPI features comprising a concave top surface, wherein said oxide spacers are formed to conform to the concave top surfaces.

4. The method of claim 1, further comprising forming a doped region within said substrate region;

forming a trench adjacent said fins within said doped regions wherein each trench comprising a center portion and two side portions about the center portion, wherein the center portion of the trench is deeper than the side portions of the trench;

forming a bottom EPI feature in a first portion of each of said trenches, wherein each EPI feature comprises a center portion and two side portions about the center portion, wherein the height of the center portion of the EPI feature is lower than the height of the side portions of the EPI feature; and forming an oxide spacer in a second portion of each trench, wherein each oxide spacer comprises a center portion and two side portions about the center portion, wherein said oxide spacers are formed to conform to the top surface of the EPI features, wherein the center portion of the oxide spacers is thicker than the side portions of the oxide spacer.

5. The method of claim 1, wherein forming said gate region above said first S/D region comprises:

forming a first low-k dielectric layer above said bottom S/D region;

forming a first high-k dielectric layer above said first low-k dielectric layer, wherein said first high-k dielectric layer is also formed on sidewalls and top regions of said fin structures;

forming a gate metal region above said first high-k dielectric layer.

6. The method of claim 5, wherein forming said space for an air gap comprises:

forming a second high-k dielectric layer above said gate metal region, wherein said second high-k dielectric layer is also formed on the sidewalls and top regions of said fins;

forming an organic planarization layer (OPL) adjacent the fins; and performing an etch back process for removing said OPL, and for removing a portion of the second high-k dielectric layer from the top portion and a portion of the sidewalls of the fin structures, thereby forming said space for the air gap.

7. The method of claim 1, wherein forming said top EPI feature above said air gap comprises forming said top EPI layer proximate a top portion of the fin structures, encapsulating said space for the air gap, thereby forming said air gap spacer, wherein said top EPI is comprised by a second S/D region.

8. The method of claim 1, further comprising:

forming a first oxide isolation feature on a first side of said fin structures;

forming a second oxide isolation feature on a second side of said fin structure;

forming a contact region above top EPI feature, between said first and second oxide isolation features; and performing a planarization process on said first and second isolation features and on said contact region.

9. The method of claim 8, wherein forming said contact region comprises depositing at least one of a tungsten material or a copper material.

10. A finFET device, comprising:

a buried source/drain (S/D) region formed on a substrate;

a set of fin structures formed above said buried S/D region;

a gate region above said buried S/D region and adjacent at least a portion of said fin structures;

an air gap spacer above said gate region; and a top epitaxial (EPI) feature above said air gap spacer.

11. The finFET device of claim 10, further comprising:

a plurality of trenches within said buried S/D region and adjacent each of said fin structure, wherein each trench comprising a center portion and two side portions about the center portion, wherein the trenches each comprise a curved shape such that the center portion of the trench has a height that is lower than said side portions of the trench;

an oxide spacer in each of said trenches, wherein each oxide spacer comprises a center portion and two side portions about the center portion, wherein a bottom region of said oxide spacers conform to said curved shapes of said trenches, wherein said center portion of the oxide spacer is thicker than said side portions of the oxide spacers.

12. The finFET device of claim 11, further comprising a bottom EPI feature in a portion of each of said trenches, said EPI features comprising a concave top surface, wherein said oxide spacers conforms to the concave top surfaces, thus each oxide spacer having tapered-end configurations.

13. The finFET device of claim 10, further comprising:

a doped region within a substrate region for forming said buried S/D region;

a plurality of trenches configured within said doped region, wherein each trench comprising a center portion and two side portions about the center portion, wherein each trench comprises a curved shape such that the center portion of the trench has a height that is lower than the side portions of the trench;

a bottom EPI feature in a first portion of each trench, said EPI feature comprising a concave top surface;

a metal liner lining said bottom EPI features; and an oxide spacer above said metal liner in each trenches, wherein each oxide spacer conforms to the concave top surface and has tapered ends.

14. The finFET device of claim 10, wherein said gate region comprises:

a first low-k dielectric layer above said buried S/D region;

a first high-k dielectric layer above said first low-k dielectric layer and on a portion of the sidewalls of said fins; and a gate metal region above said first high-k dielectric layer.

15. A system, comprising:

a semiconductor device processing system to manufacture a semiconductor device comprising at least one fin field effect transistor (finFET); and a processing controller operatively coupled to said semiconductor device processing system, said processing controller configured to control an operation of said semiconductor device processing system;

wherein said semiconductor device processing system is adapted to:

form a bottom source/drain (S/D) region on a substrate;

form a set of fin structures above said bottom S/D region;

form a plurality of trenches each adjacent said each of the fin structures, and within said bottom S/D region, wherein each of the trenches comprising a center portion and two side portions about the center portion, and wherein the center portions of the trenches are deeper than the side portions of the trench, thereby forming an upwardly curved shape at the bottom regions of the trenches; and form an oxide spacer in each of said trenches, wherein each oxide spacer comprises a bottom portion, a center portion and two side portions about the center portion, and wherein the bottom portion of said oxide spacers conform to said upwardly curved shape of said trenches, wherein the center portions of the oxide spacers are thicker than the side portions of the oxide spacers.

16. The system of claim 15, further comprising a design unit configured to generate a design comprising a definition for a plurality of processes and a definition for an operation of a FinFET device that comprises a plurality of fins, wherein data from said design unit is used by said process controller to control an operation of said semiconductor device processing system.

17. The system of claim 15, wherein said semiconductor device processing system is further adapted to:

form a doped region within said substrate region for forming said bottom S/D region;

form said trenches adjacent said fins within said doped region;

form a bottom EPI feature in a first portion of each of said trenches, said EPI features comprising a concave top surface; and form said oxide spacers in a second portion of each of said trenches, wherein said oxide spacers are formed to confirm to the concave top surface of said EPI features.

18. The system of claim 15, wherein said semiconductor device processing system is further adapted to:

form a first low-k dielectric layer above said bottom S/D region;

form a first high-k dielectric layer above said first low-k dielectric layer, wherein said first high-k dielectric layer is also formed on sidewalls and top regions of said fin structures;

form a gate metal region above said first high-k dielectric layer;

form a second high-k dielectric layer above said gate metal region, wherein said second high-k dielectric layer is also formed on the sidewalls and top regions of said fins;

form an organic planarization layer (OPL) adjacent the fins; and form an etch back process for removing said OPL, and for removing a portion of the second high-k dielectric layer from the top portion and a portion of the sidewalls of the fin structures.

19. The system of claim 15, wherein said semiconductor device processing system is further adapted to:

form a gate region above said bottom S/D region;

form a space for an air gap above said gate region; and form a top epitaxial (EPI) feature extending over said space for the air gap, thereby forming an air gap spacer between said top epitaxial feature and said gate region.

20. The system of claim 19, wherein said semiconductor device processing system is further adapted to form said air gap spacer at a thickness that is sufficient for reducing a parasitic capacitance at said gate region.

* * * * *